United States Patent [19]
Shreve et al.

[11] Patent Number: 6,100,728
[45] Date of Patent: Aug. 8, 2000

[54] COIL CURRENT LIMITING FEATURE FOR AN IGNITION COIL DRIVER MODULE

[75] Inventors: John Robert Shreve, Kokomo; Gregg Nelson Francisco, Cicero; Scott Birk Kesler, Kokomo, all of Ind.

[73] Assignee: Delco Electronics Corp., Kokomo, Ind.

[21] Appl. No.: 08/977,363

[22] Filed: Nov. 24, 1997

Related U.S. Application Data

[63] Continuation of application No. 08/550,317, Oct. 30, 1995, abandoned, which is a continuation-in-part of application No. 08/508,402, Jul. 31, 1995, abandoned.

[51] Int. Cl.⁷ .................................................... H03B 1/00
[52] U.S. Cl. ................................................................ 327/110
[58] Field of Search .................................. 327/110, 365, 327/480, 577; 123/644

[56] References Cited

U.S. PATENT DOCUMENTS

| | | | |
|---|---|---|---|
| 4,147,145 | 4/1979 | Domland et al. | 123/148 E |
| 4,368,717 | 1/1983 | Roberts et al. | 123/632 |
| 4,402,299 | 9/1983 | Nakao et al. | 123/632 |
| 4,774,925 | 10/1988 | Iwara | 123/644 |
| 4,915,086 | 4/1990 | Ciliberton et al. | 123/609 |
| 4,929,884 | 5/1990 | Bird et al. | 323/313 |
| 4,961,006 | 10/1990 | Pace et al. | 307/270 |
| 5,146,907 | 9/1992 | Sawazaki et al. | 123/644 |
| 5,199,407 | 4/1993 | Sawazaki et al. | 123/644 |
| 5,396,117 | 3/1995 | Housen et al. | 327/480 |
| 5,397,964 | 3/1995 | Edwards | 315/209 T |
| 5,424,665 | 6/1995 | Sueri et al. | 327/108 |
| 5,581,131 | 12/1996 | Urushiwara et al. | 307/10.6 |
| 5,603,308 | 2/1997 | Ooyabu et al. | 123/644 |
| 5,642,253 | 6/1997 | Shreve | 361/152 |
| 5,723,916 | 3/1998 | Disney et al. | 307/131 |
| 5,781,047 | 7/1998 | Shreve et al. | 327/110 |
| 5,819,713 | 10/1998 | Kesler | 123/630 |

*Primary Examiner*—Jeffrey Zweizig
*Attorney, Agent, or Firm*—Jimmy L. Funke

[57] ABSTRACT

The ignition coil driver module of the present invention includes a control integrated circuit, formed of a low voltage semiconductor material, and a high current load driver integrated circuit, formed of a high voltage integrated circuit, housed within a common package. The high current load driver integrated circuit is responsive to a low voltage drive signal provided by the control integrated circuit to permit a load current to flow unrestricted through the load driver integrated circuit and an inductive load connected thereto. The control integrated circuit includes a sense resistor which receives the load current from the high current load driver integrated circuit, converts this current to a sense voltage, compares the sense voltage to a reference voltage generated within the control integrated circuit, and forces the low voltage drive signal to drop to a level which will limit the load current to a predetermined current value.

16 Claims, 8 Drawing Sheets

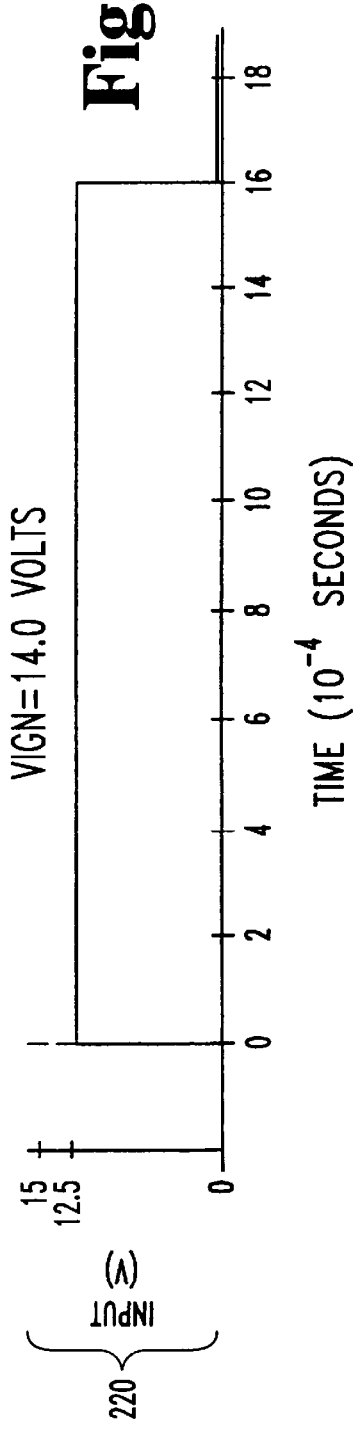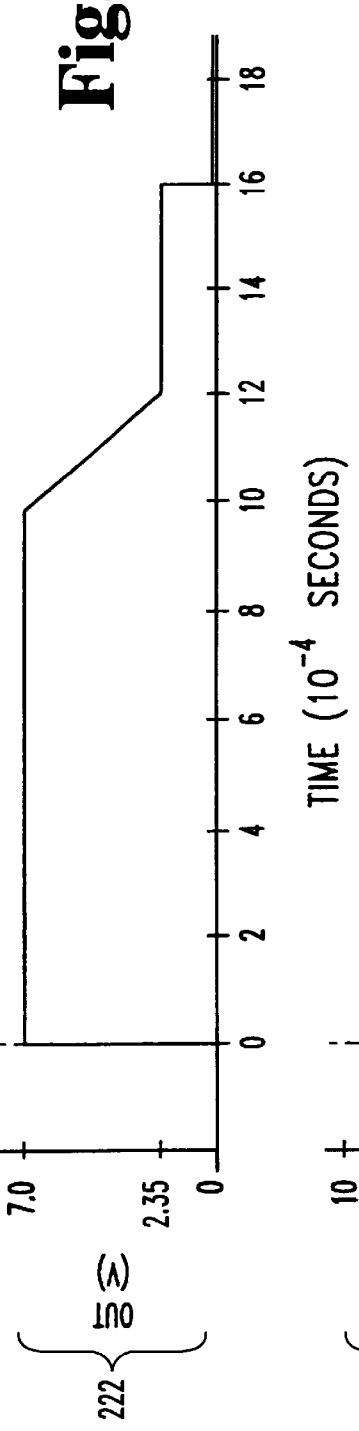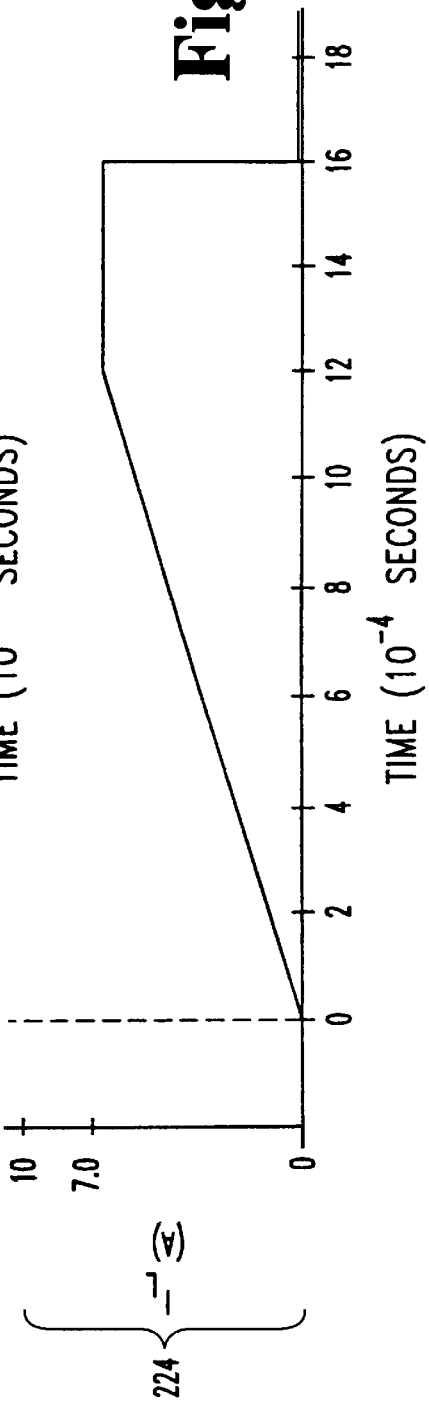

COIL CURRENT LIMITING FEATURE FOR AN IGNITION COIL DRIVER MODULE

CROSS-REFERENCE TO RELATED APPLICATION

The present application is a continuation of U.S. application Ser. No. 08/550,317 filed Oct. 30, 1995 and now abandoned, which is a continuation-in-part of U.S. application Ser. No. 08/508,402 filed Jul. 31, 1995, and entitled, "IGNITION COIL DRIVER MODULE INCLUDING COIL CURRENT LIMITING FEATURE," now abandoned.

BACKGROUND OF THE INVENTION

The present invention relates generally to circuitry for driving an ignition coil of an electronic ignition system, and more specifically to such circuitry incorporating an ignition coil current limiting feature therein.

In the past few decades, the automotive industry has striven to expand both the number and types of vehicular functions and systems subject to computer control. As an example of one such system subject to computer control, a modern automotive ignition system typically includes an ignition coil and a coil current switching device responsive to an ignition, or "drive", signal to energize the ignition coil. Control circuitry, typically under the direction of a microprocessor-based controller, provides the drive signal to the coil current switching device to thereby energize the primary side of the ignition coil.

Upon initially energizing the ignition coil, the coil current begins to increase, as is common with inductive loads. In accordance with one type of ignition application, known in the industry as a "ramp and hold" application, the current in the coil is held at a constant specified level until the spark plug is instructed to fire. Such a ramp and hold application thus requires an ignition coil current limiting feature to ensure proper operation. Another type of ignition application, known in the industry as a "ramp and fire" application, requires the spark plug to fire when the current in the coil increases to within a particular current range. Although the ramp and fire operation itself does not require a coil current limiting feature, one or more undesirable effects may result under certain conditions unless some type of upper coil current limit is established.

First, the primary side of the ignition coil may saturate at high coil current values, thereby reducing the total energy delivered to the secondary coil and ultimately to the spark plug. Second, an ignition control system error or fault condition may result in the ignition coil being energized for an extended period of time (commonly referred to as an excessive dwell or "on" time). This condition, in turn, results in excessive current flow through the coil current switching device, which may ultimately result in damage to the coil current switching device or to the coil itself. Such a fault condition may occur within either of the foregoing ignition applications.

It is therefore desirable in most ignition applications to provide circuitry for implementing a coil current limiting feature by establishing a maximum current that may flow through the primary ignition coil.

One type of prior art automotive ignition system incorporates the control circuitry and coil current switching device into a single ignition module using a so-called hybrid electronics technology. Essentially, hybrid electronics is an amalgamation of integrated circuit technology and discrete electronic component technology arranged and surface mounted on a ceramic substrate. An example of a portion of one such prior art hybrid ignition control module 10 is shown in FIG. 1. Referring to FIG. 1, ignition control circuitry 12 is connected to a voltage 'source ($V_{BATT}$) 14 and provides the voltage $V_{BATT}$ as VIGN 16 when the engine is running. VIGN 16 is connected to one end of a coil primary 18 which is connected at its opposite end to the drain 20 of power MOSFET 22. The source 24 of MOSFET 22 is connected to one end of a resistor $R_{SL}$ 28 which is also connected to a voltage sense input 30 of the ignition control circuitry 12. The opposite end of $R_{SL}$ 28 is connected to a ground reference. The gate 26 of MOSFET 22 is connected to a gate drive output of ignition control circuitry 12. In operation, the gate 26 is provided with a gate drive voltage from ignition control circuitry 12 which turns on MOSFET 22 so that the coil current $I_L$ flows through coil primary 18, MOSFET 22 and $R_{SL}$ 28. As $I_L$ increases, the voltage across $R_{SL}$ thus increases, and this voltage increase is monitored at sense voltage input 30 of ignition control circuitry 12. When the voltage across $R_{SL}$ increases to a predetermined level, the ignition control circuitry decreases the gate drive voltage to the gate 26 such that a relatively constant maximum coil current $I_L$ is maintained.

Designers of automotive ignition modules have recently attempted to provide smaller and more reliable ignition modules by designing so-called "single chip" ignition coil control circuits. Such circuits incorporate the control circuitry and coil driver device into a single high voltage integrated circuit, typically formed of silicon. An example of a portion of one such prior art "single chip" ignition coil driver circuit 50 is shown in FIG. 2. Referring to FIG. 2, input IN 52 is connected to drive control circuitry 54, which is further provided with a voltage source input $V_S$ 56 for receiving a supply voltage thereat. Drive control circuitry 54 also has an output connected to the base of transistor 58 which forms part of a darlington-connected bipolar transistor pair 60. The collector 62 of the transistor pair 60 is connected to one end of an ignition coil primary 64, with the opposite end of coil primary being connected to battery voltage $V_{BATT}$ 66. The output emitter 68 of transistor pair 60 is connected to one end of a resistor $R_{SL}$ 70, with the opposite end of $R_{SL}$ 70 being connected to a ground reference. The output emitter 68 of transistor pair 60 is further connected to one input of an amplifier 72, with another input of amplifier 72 being connected to a reference voltage $V_{REF}$ 74. The output 76 of amplifier 72 is connected to drive control circuitry 54.

The operation of ignition coil driver circuit 50 is similar in many respects to module 10 of FIG. 1. In circuit 50, a control signal is received at input IN 52 to which drive control circuitry 54 is responsive to drive the base 58 of darlington-connected transistor pair 60. As transistor pair 60 turns on, an increasing load current $I_L$ flows through the coil primary 64, transistor pair 60 and resistor $R_{SL}$ 70. The voltage drop across $R_{SL}$ 70 is compared to $V_{REF}$ 74 by amplifier 72, and the drive control circuitry 54 decreases the drive voltage to the base 58 of transistor pair 60 as the voltage across $R_{SL}$ 70 approaches that of $V_{REF}$. When the load current $I_L$ reaches a predetermined magnitude, drive control circuitry 54 maintains a drive voltage at the base 58 of transistor pair 60 to thereby maintain the predetermined magnitude of $I_L$ flowing through the coil primary 64 for the duration of the control signal. Thus, the coil current limiting feature of circuit 50 is essentially identical to that of module 10, wherein the operation of amplifier 72 represents one known technique for utilizing the voltage drop across a sense resistor $R_{SL}$ to limit the load current $I_L$ therethrough.

Although the foregoing prior art approaches for limiting ignition coil current have been well received in the automotive industry, they suffer from several inherent drawbacks. First, the current limiting operation depends on the voltage drop across the sense resistor $R_{SL}$ (28 and 70), which adds to the coil driving device's (22 and 60) saturation voltage. This has the effect of increasing power dissipation and reducing power to the coil primary.

Second, since the load current $I_L$ in the coil primary is typically on the order of tens of amperes, the sense resistor $R_{SL}$ must be sufficiently robust to dissipate the high power associated with such a load current. In prior art hybrid ignition control modules, discrete sense resistors having 5–10 Watt power ratings have been used to insure safe dissipation of power. However, since the voltage drop across the load current sense resistor is often compared to a reference voltage generated within integrated circuitry, this approach sacrifices accuracy due to inherent mismatches between discrete and integrated circuit components, particularly over the wide temperature ranges typically required of automotive circuitry. Achieving greater accuracy requires resorting to a "single chip" approach wherein the voltage developed across the load current sense resistor and the reference voltage circuitry are each generated "on chip", preferably using matching circuit components. However, "single chip" ignition coil driver circuits have their own inherent disadvantages which are discussed in greater detail in related U.S. Ser. No. 08/522,982, filed Jul. 31, 1995, entitled IGNITION COIL DRIVER MODULE, filed by John R. Shreve et al., and assigned to the assignee of the present invention.

What is therefore needed is an ignition coil driver arrangement having a coil current limiting feature that overcomes the foregoing undesirable characteristics associated with the prior art approaches. Such an ignition coil driver arrangement should be easily and inexpensively produced to form an advantageously compact device which is both reliable and accurate in its coil current limiting feature.

SUMMARY OF THE INVENTION

The foregoing shortcomings of the prior art are addressed by the present invention. In accordance with one aspect of the present invention, a method of limiting current through a load connected in series with a voltage source and a high current load energizing device comprises the steps of: (1) driving the high current load energizing device with a low voltage drive circuit sufficiently to permit a load current equivalent to that demanded by the load to flow from the voltage source through the load and the high current load energizing device, (2) directing the load current through the low voltage drive circuit, (3) monitoring the load current flowing through the low voltage drive circuit, and (4) driving the load energizing device with the low voltage drive circuit sufficiently to limit the load current flowing therethrough to a predetermined load current value in response to the load current exceeding the predetermined load current value.

In accordance with another aspect of the present invention, a load driving circuit having a load current limiting feature comprises a load driving device responsive to a load drive signal to permit a load current to flow through the load driving device and a load connected thereto, and a control circuit connected to the load driving device to provide the load drive signal thereto and receive the load current therefrom. The control circuit is responsive to the load current flowing therethrough to provide a first load drive signal if the load current is below a predetermined current value, and to provide a second reduced load drive signal if the load current exceeds said predetermined current value.

In accordance with a further aspect of the present invention, a load driving circuit having a load current limiting feature comprises a first integrated circuit formed of a high voltage semiconductor material and responsive to a load drive signal to permit a load current to flow through the first integrated circuit and an inductive load connected thereto, and a second integrated circuit formed of a low voltage semiconductor material and connected to the first integrated circuit to provide the load drive signal thereto and receive the load current therefrom. The second integrated circuit is responsive to the load current flowing therethrough to provide a first load drive signal if the load current is below a predetermined current value, and to provide a second reduced load drive signal if the load current exceeds the predetermined current value.

One object of the present invention is to provide a coil current limiting feature for an ignition coil driver module which utilizes a control circuit formed of a low voltage semiconductor material operable to receive the coil current and limit the coil current to a predetermined maximum current value.

Another object of the present invention is to provide ignition coil current limiting circuitry wherein the coil current is received by a low voltage control circuit to develop a voltage which is compared to a reference voltage such that the coil current is limited to a maximum value when the developed voltage is approximately equal to the reference voltage.

These and other objects of the present invention will become more apparent from the following description of the preferred embodiment.

BRIEF DESCRIPTION OF THE DRAWINGS

FIG. 5 is composed of FIGS. 5A–5C and illustrates a waveform diagram showing typical operation of the ignition coil driver module of FIG. 3 in the ignition control system of FIG. 4.

DESCRIPTION OF THE PREFERRED EMBODIMENT

Figure 1:
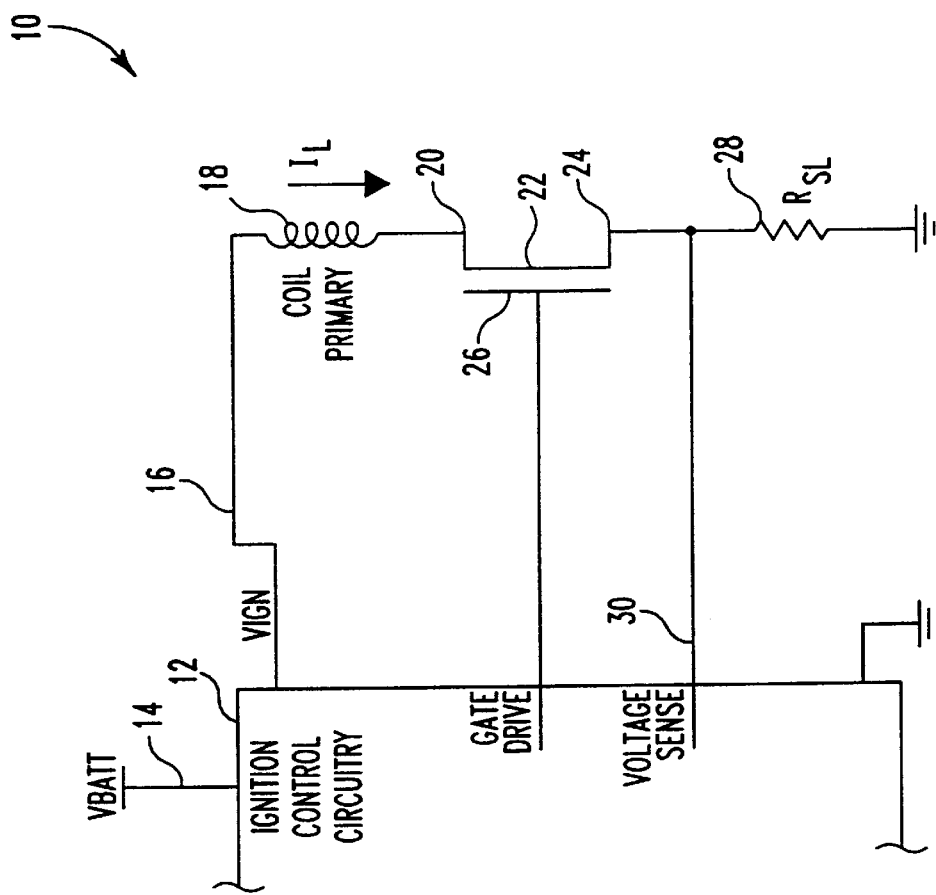
FIG. 1 is a schematic diagram of a portion of a prior art ignition coil driver arrangement.
Figure 2:
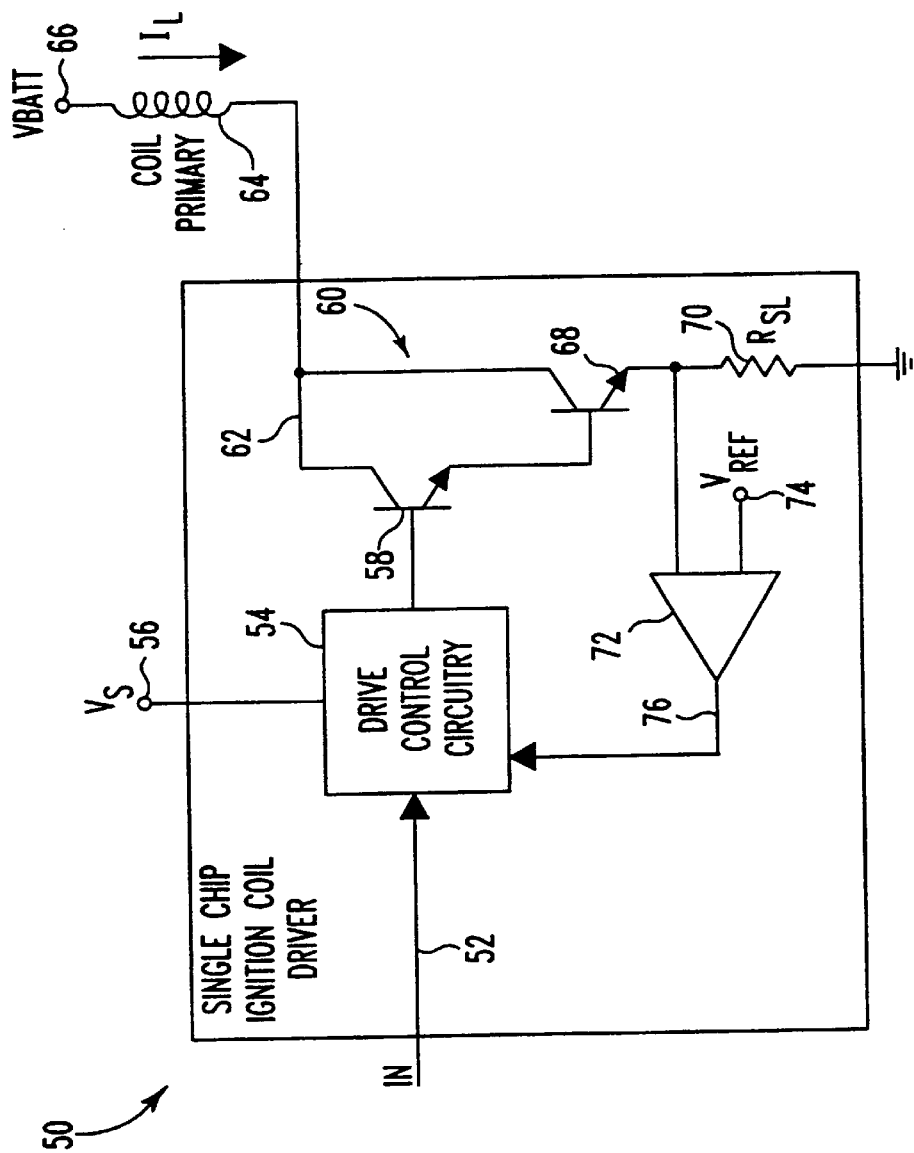
FIG. 2 is a schematic diagram of a portion of another prior art ignition coil driver arrangement.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Figure 3:
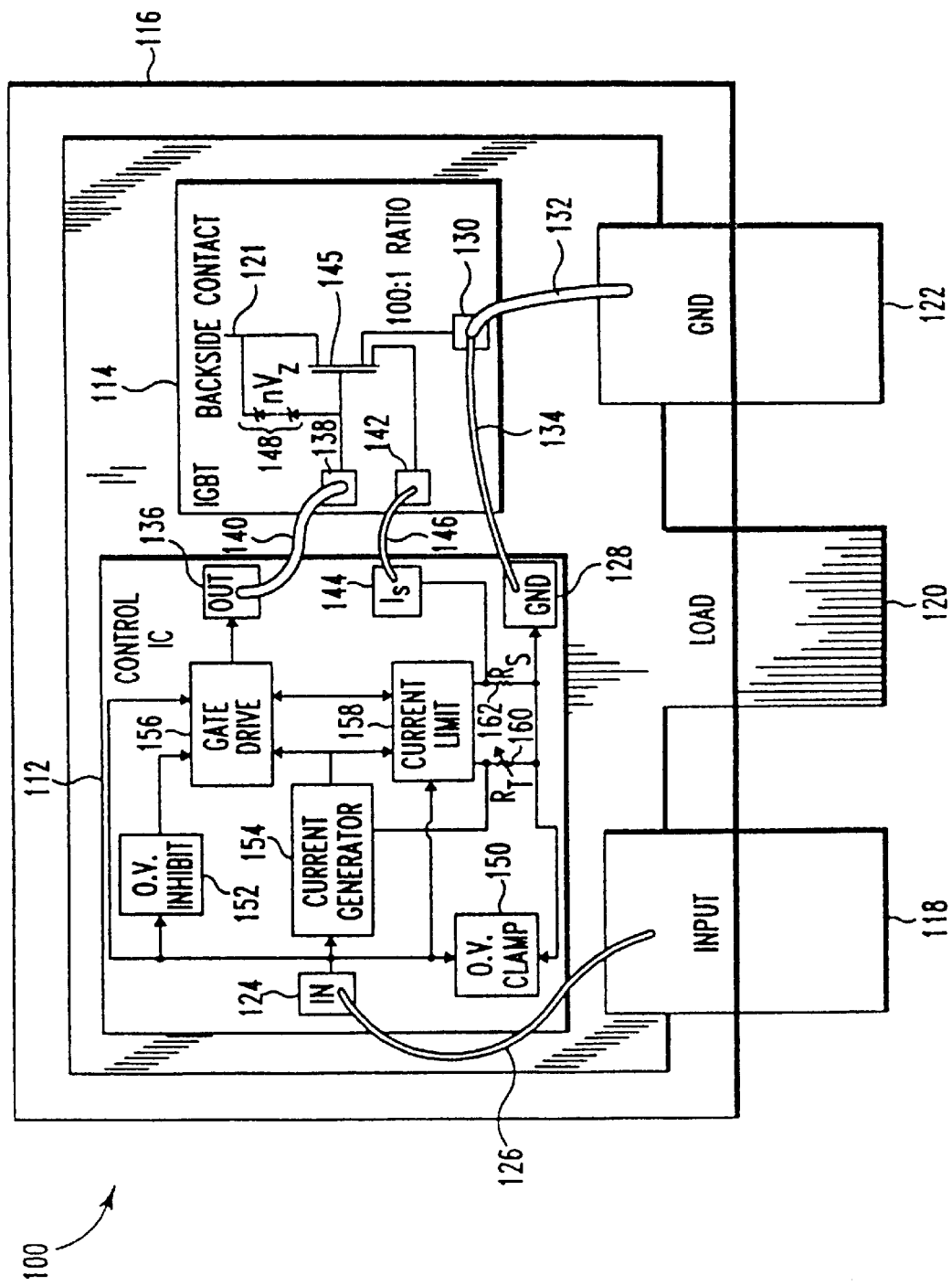
FIG. 3 is a schematic diagram of a preferred embodiment of an ignition coil driver module in accordance with the present invention.

Referring now to FIG. 3, a preferred embodiment of an ignition coil drive module 100, in accordance with the present invention, is shown. Ignition coil drive module 100 includes a control integrated circuit 112 and a high current load drive integrated circuit 114 mounted within a housing 116. Housing 116 may include a number of electrically conducting terminals extending therein to provide electrical connection to either of the circuits 112 and 114. In a preferred embodiment, as shown in FIG. 3, housing 116 includes three such electrical terminals.

A first terminal 118 (INPUT) extends into housing 116 and is electrically connected to an input 124 (IN) of the control integrated circuit 112, preferably via a bond wire 126, as is commonly known within the integrated circuit industry.

A second terminal 120 (LOAD) extends into housing 116 and is electrically connected to a load current input 121 of the high current load drive circuit 114. Preferably, terminal 120 forms an integrated circuit mount for mounting integrated circuits 112 and 114 thereto. Further, the substrate of high current load drive integrated circuit 114 is preferably the load current input 121 thereto so that electrical connection between terminal 120 and load current input 121 may be made by mounting circuit 114 to terminal mount 120 via an electrically conducting attachment medium. Generally, the electrically conducting integrated circuit attachment medium serves two functions. First, it should be formed of a material that will maintain both a structural and electrical bond between circuit 114 and terminal 120 under high temperatures generated by the conduction of load current through the circuit 114. Second, it should be formed of a material having high thermal conductivity so that heat generated by the conduction of load current through circuit 114 may be effectively passed to terminal 120, which also acts as a heat sink for the module 100. Preferably, the electrically conducting attachment medium is an integrated circuit mounting solder, as is commonly known in the integrated circuit industry.

A third terminal 122 (GND) extends into housing 116 and is electrically connected to ground references 128 and 130 of control integrated circuit 112 and high current drive integrated circuit 114 respectively, preferably via bond wires 134 and 132 respectively. As is common in the integrated circuit industry, the substrate of control integrated circuit 112 is preferably connected to ground reference 128. Thus, attachment of control integrated circuit 112 to terminal 120 must be made via an electrically insulating medium to avoid shorting the load current input 121 of the high current load drive integrated circuit 114 to ground potential. Preferably, the electrically insulating attachment medium is an electrically non-conductive epoxy.

Housing 116 is preferably formed of an integrated circuit encapsulant commonly known in the integrated circuit industry. In its final form, the ignition coil driver module 100 is provided as a three-pin integrated circuit package, preferably having either a TO-247 or TO-264 package configuration. However, the present invention contemplates providing ignition coil driver module 100 in any of a variety of known package configurations, or in a custom package configuration, an important advantage of module 100 being a significant size and weight reduction over prior art hybrid-type ignition modules. A more detailed description of the ignition coil driver module 100 mechanical structure is provided in related U.S. Pat. No. 5,781,047, entitled IGNITION COIL DRIVER MODULE, filed by John R. Shreve et al., and assigned to the assignee of the present invention.

In addition to input IN 124, control integrated circuit 112 further includes an output 136 (OUT) for providing a "drive" signal to a corresponding input 138 of high current load drive integrated circuit 114. Further, high current load drive integrated circuit 114 includes an output 142 for feeding back a portion of the load current to an input 144 ($I_S$) of control integrated circuit 112. OUT 136 is connected to input 138, and output 142 is connected to $I_S$ 144, preferably by bond wires 140 and 146 respectively.

An important advantage of the present invention is the partitioning of the ignition coil drive functions into a control integrated circuit 112 and a high current load drive integrated circuit 114. All functions typically considered to be "control" functions, examples of which will be provided hereinafter, are incorporated into the control integrated circuit 112, and the high current load drive integrated circuit 114 provides the necessary drive capability to energize the load. In a typical application of module 100, the load is a primary coil of an automotive ignition coil, which generally has high voltages and load currents associated therewith. Since voltages within the 400–600 volt range, and load currents within the 500 milliampere to 20 ampere range, are typically encountered in normal operation of the primary of an automotive ignition coil, integrated circuit 114, preferably formed of silicon, must be manufactured using a high voltage semiconductor process capable of operating at voltages in excess of 600 volts. The control integrated circuit 112, on the other hand, need only operate at low voltages to provide control functions internal to circuit 112 and to provide a sufficient drive signal to circuit 114. Typical voltage levels associated with control integrated circuit 112 operation may range from between approximately 3.0 volts to approximately 24 volts. Integrated circuit 112, also preferably formed of silicon, may therefore be manufactured using a standard (and comparatively inexpensive) low voltage process typically operating at voltages of less than 24 volts. One such common low voltage bipolar integrated circuit process is capable of withstanding, without damage thereto, voltages up to the 40–60 volt range. Thus, the integrated circuit partitioning approach of the present invention, as illustrated with the ignition coil driver module 100 of FIG. 3, offers the size and weight advantages (as well as other advantages discussed hereinafter) that prior art "single chip" ignition coil drive circuits enjoy over similar hybrid-type approaches, while further offering the advantage of providing much of the module 100 circuitry, namely control circuit 112, with a low cost and commonly used low voltage integrated circuit process technology.

High current load driver integrated circuit 114 includes a power transistor 145 as its central component. Transistor 145 has a drive input 138 which is responsive to a drive signal to provide a load current conduction path between load current input 121 and output 130 (typically ground referenced). As seen in FIG. 3, transistor 145 also includes a second output 142 which provides a fraction of the load current thereat, as will be more fully discussed hereinafter. Transistor 145, as previously indicated, must be capable of operating at load currents of between approximately 500 milliamperes and 20 amperes. Although the load may typically be the primary coil of an automotive ignition coil, the present invention contemplates utilizing the integrated circuit partitioning approach disclosed herein to provide load drive capability to a wide variety of such high current loads. As one example of such a high current load, fuel injectors for internal combustion engines are typically inductive loads requiring load currents in the range of approximately 500 milliamperes to approximately 10 amperes. Other such high load current uses for the integrated circuit partitioning approach of the present invention will become apparent to those skilled in the integrated circuit and electronic system design arts.

A phenomena known as "inductive flyback" is known to occur when driving inductive loads with a circuit configuration of the type shown in FIG. 3. Essentially, this phenomena occurs when a high current has been established at transistor input 121, and the drive signal to the input 138 of transistor 145 is thereafter removed. The subsequent inductive "flyback" effect creates a high voltage at input 121 which may exceed the reverse breakdown voltage of the transistor 145 junctions located between input 121 and output 130. The combination of this high voltage and full load current creates a potentially destructive condition for transistor 145. To guard against such potential damage, it is known to provide a series, or stack, of n zener diodes 148 between inputs 121 and 138 of transistor 145. The number n is chosen so that the aggregate breakdown (avalanche) voltage of the zener diode stack 148 is less than the minimum avalanche breakdown voltage of the transistor 145 junctions located between input 121 and output 130. In operation, if the high voltage at input 121 created by the "flyback" effect exceeds the zener diode stack 148 aggregate breakdown voltage, current flows through stack 148, thereby turning transistor 145 back on. In this manner, the voltage at input 121 of transistor 145 is actively clamped at a maximum voltage approximately equal to the aggregate breakdown voltage of zener diode stack 148.

Preferably, power transistor 145 is a known metal-oxide-semiconductor field effect transistor (MOSFET) variant known in the semiconductor industry as an insulated gate bipolar transistor (IGBT), although the present invention further contemplates using other known power transistors as transistor 145 such as, for example, a power BJT or a power MOSFET. Although such power output devices may not provide optimal operating characteristics for ignition coil drive module 100, other considerations may require their use. Moreover, other applications of the integrated circuit partitioning concepts of the present invention may require, in some circumstances, the use of such other power output devices. It is to be understood that the use of such power output devices in any such system employing the integrated circuit partitioning concepts and coil current limiting concepts disclosed herein is intended to fall within the scope and spirit of the present invention.

Power transistor 145 further includes an output leg 142 extending therefrom. Output leg 142 of IGBT 145 is set up to provide a sense current which is preferably a 100:1 ratio of the load current flowing from input 121 to output 130. Thus, if the load current flowing from input 121 to output 130 is equal to 6 amperes, the current flowing through output leg 142 will be approximately 60 milliamperes, thus resulting in a total load current through IGBT 145 of approximately 6.06 amperes. If power transistor 145 is a typical BJT, the 100:1 ratioing may be accomplished through appropriate ratioing of emitter areas, as is known in the art of integrated circuit design. IF power transistor 145 is a MOSFET or IGBT, the 100:1 ratioing may be accomplished by isolating an appropriately sized portion of the transistor source diffusion, and providing the isolated portion as source leg 142. Those skilled in the art will recognize that any desired sense current to load current ratio may be provided through appropriate sizing of the BJT emitter areas or source diffusion isolation.

Figure 6:
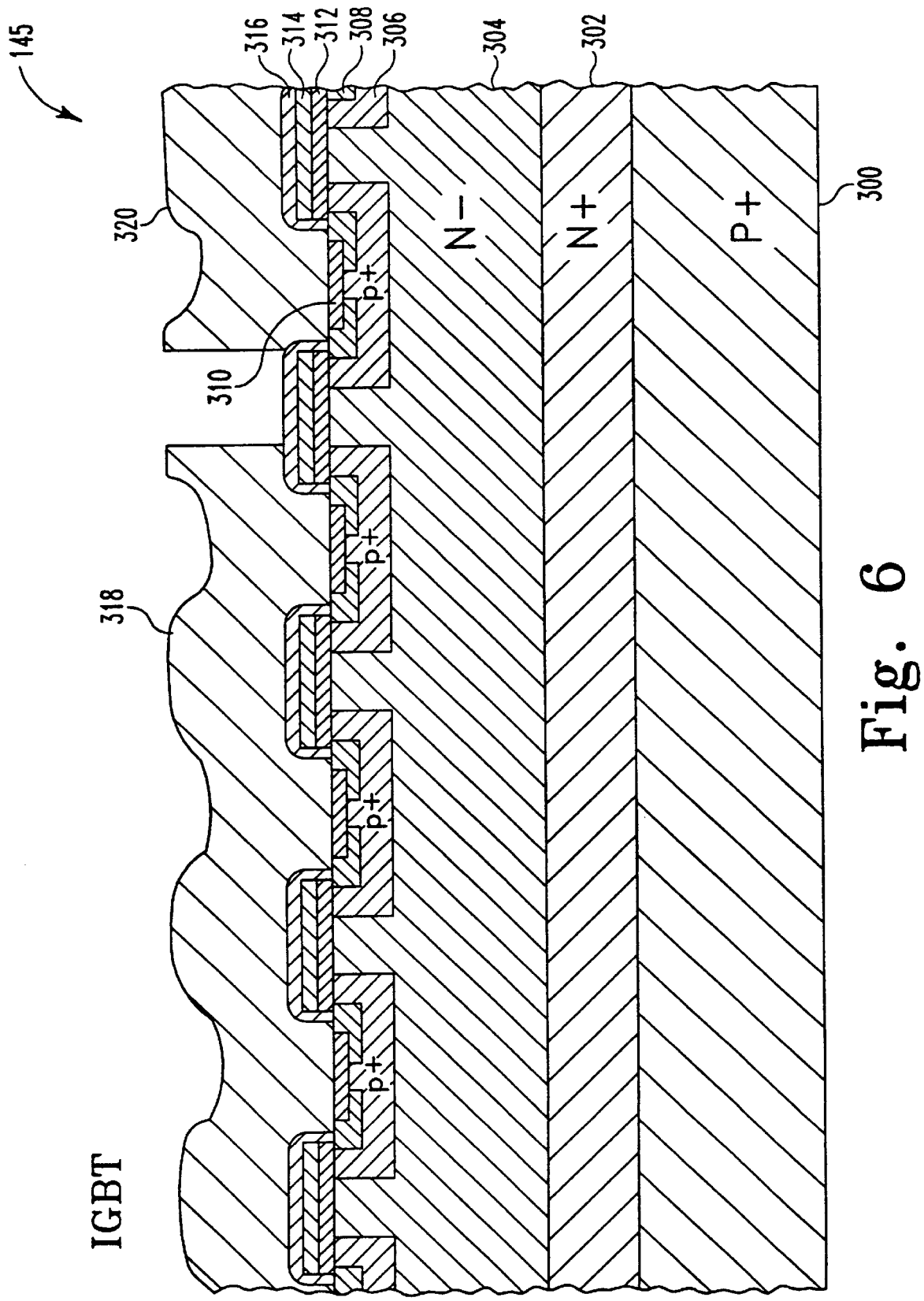
FIG. 6 is a cross sectional view of a portion of an insulated gate bipolar transistor used in the ignition coil driver module of the present invention.

Referring now to FIG. 6, a cross sectional view of a preferred construction of IGBT 145 is shown formed of a semiconductor material, preferably silicon, in accordance with known semiconductor processing techniques. Details of the zener diode stack 148 are not shown in FIG. 6 for ease of illustration. Construction of IGBT 145 begins with a P$^+$ substrate 300 upon which an N$^+$ buffer layer is either grown or deposited. The P$^+$ substrate 300 corresponds to the input 121 of IGBT 145 as shown in FIG. 3. An N$^-$ epitaxial layer 304 is grown on top of N$^+$ buffer layer 302 and a series of equally spaced apart p$^+$ wells 306 are diffused therein. Within each of the p$^+$ wells 306, a pair of equally spaced apart n$^+$ wells 308 are diffused therein. A contact 310 is made to a portion of each of the n$^+$ well pairs 308 and to the host p$^+$ well 306 therebetween. The p$^+$ 306 well, n$^+$ well pairs 308 and contact 310 thus define a series of "cells" within the N$^-$ epitaxial layer 304.

Sections of gate oxide 312 are grown or otherwise deposited on top of the foregoing silicon layers and extend generally between n$^+$ wells 308 of adjacent p$^+$ wells 306. A layer of conductive gate material 314, preferably polysilicon, is deposited on top of each of the gate oxide sections 312. Although not shown in FIG. 6, the individual polysilicon gates 314 are connected together to form the gate 138 of IGBT 145 as shown in FIG. 3. An insulating layer 316, preferably made of SiO$_2$, silicon nitride (Si$_3$N$_4$), polyimide or the like, is grown or otherwise deposited around each of the polysilicon gates 314 to thereby electrically insulate them from above.

A metal layer 318, corresponding to output leg 130 of IGBT 145 as shown in FIG. 3, is deposited on top of a portion of the preceding semiconductor layers so as to make electrical contact with some of the contacts 310. Finally, a metal layer 320, corresponding to output leg 142 of IGBT 145 as shown in FIG. 3, is deposited on top of a separate portion of the preceding semiconductor layers so as to make electrical contact with the remaining contacts 310. Preferably, metal layers 318 and 320 are formed of a single metal layer which is selectively patterned to provide portions 318 and 320, although the present invention contemplates providing layers 318 and 320 as separate metal layers. In order to provide the 100:1 ratio of load current to sense current previously described, metal layer 318 should form an electrical connection with 100 contacts 310 for every 1 contact 310 electrically connected to metal layer 320. In this way, a small number of source cells may be "split out" to provide a sense current path.

IGBT 145 is a normally off transistor, meaning that when no bias is applied to the gate 314 (138 of FIG. 3), no current flows from the input 300 (121 of FIG. 3) to the outputs 318 and 320 (130 and 142 respectively of FIG. 3) even though a voltage may be present at the input 300. This is so because, although the P$^+$ 300-N$^+$ 302 junction may be forward biased under such a condition, the N$^-$ 304-p$^+$ 306 junctions are reverse biased, thereby blocking current flow therethrough. However, IGBT 145 may be turned on to full conduction with the application of a small current at its gate 314 (138 of FIG. 3) to charge its gate capacitance to approximately 2–4 volts. Typically, this small input current is within the range of between approximately 200 micro amperes to approximately 3.0 milliamperes, which causes the p$^+$ 306 surface located under the gate oxide layer 312 to invert, thereby creating an n-type channel between N⁻ epitaxial layer 304 and each of the n⁺ wells 308. Under this condition, the potential of N⁻ layer 304 is pulled down toward that of metal layers 318 and 320 (typically set at or near ground potential). The P⁺ 300 substrate is typically connected to a high voltage so that when the above-described inversion occurs, a power bipolar PNP transistor having an emitter corresponding to P⁺ layer 300, a base corresponding to N⁻ layer 304, and a collector corresponding to P⁺ layer 306, turns on to conduct current from substrate 300 to metal layers 318 and 320.

Apart from the low current drive requirements of IGBT 145, another advantage of using such a device lies in its inherent reverse voltage blocking capability. With a darlington-connected bipolar junction power transistor (BJT) pair commonly used as a power output device in prior art ignition coil driver systems, a normally reverse-biased parasitic body diode exists across the collector-emitter of the transistor pair. This parasitic diode is inherent in the construction of such a darlington-connected bipolar transistor pair. Thus, if the battery, typically connected between the ignition coil primary and ground, is connected with reverse polarity, the parasitic body diode becomes forward biased, thereby conducting potentially high current back through the ignition coil primary. IGBT 145, by contrast, has no such parasitic body diode between the P⁺ 300 layer (input 121) and the n⁺ well pairs 308 (outputs 130 and 142) so that the reverse breakdown voltage between output 130 and input 121 is much higher than typical battery voltages, thereby blocking potentially high current flow through the coil primary under a reverse battery condition.

A further advantage of using IGBT 145 is that this type of device is not susceptible to thermal runaway which is often a design concern when implementing power BJTs. Essentially, thermal runaway may occur in a BJT because the collector current in such a device increases with increased junction temperature. This phenomenon becomes a concern when driving inductive loads where power dissipation increases with increased collector current, thereby resulting in further increased junction temperatures. This effect can become cumulative in a BJT if proper corrective actions are not taken, such as through proper heat sinking and robust transistor design, eventually resulting in destruction of the BJT. Since IGBT 145 does not have a typical collector junction, but rather an inversion channel for permitting current flow through the device, IGBT 145 advantageously offers more robust and reliable operation during high temperature/high current operating conditions than prior art ignition coil driver circuits using BJTs as the power output device.

Referring again to FIG. 3, the functional blocks of control integrated circuit 112 will now be described in detail. It should first be pointed out that IN 124 is connected to every functional block shown within the borders of integrated circuit 112, and that no power supply input to circuit 112 exists. Since the control integrated circuit 112 may be manufactured from a low voltage semiconductor process as previously indicated, and since IGBT 145 has low input current requirements, the entire control circuit 112 does not require much current to operate. Typically the total current required by control integrated circuit 112 is between approximately 2–3 milliamperes. As such, a power supply connection to the circuit 112 is not required and all circuitry on the control integrated circuit 112 is simultaneously powered and activated through a control signal at input IN 124. In other words, a control signal at input IN 124 instructs module 100 to turn on and activate IGBT 145 for as long as the control signal is present.

Input IN 124 is connected to an over-voltage clamp circuit 150 which clamps the control signal at input IN 124 at a clamp voltage of between approximately 32–40 volts to prevent damage to the control circuit 112. Over-voltage clamp circuit 150 essentially utilizes a stack of zener diodes in series with a known "$V_{be}$ multiplier" to establish the clamp voltage as is known in the integrated circuit design art. In implementing circuit 112 with a known low voltage bipolar semiconductor process, a stack of four such diodes are used, each having an avalanche breakdown voltage of between approximately 7–8 volts, in series with a $V_{be}$ multiplier (established by multiplying a base/emitter voltage drop of approximately 600–800 millivolts by a resistor ratio as is known in the art), thus resulting in a clamp voltage of between approximately 32–40 volts.

Input IN 124 is further connected to an over-voltage inhibit circuit 152 which is further connected to a gate drive circuit 156. Over-voltage inhibit circuit 152 monitors the control signal at input IN 124 and inhibits operation of the gate drive circuitry 156 if the voltage at input IN 124 exceeds a normal battery voltage level. Typically, a battery voltage of above approximately 24 volts is considered to exceed a normal battery voltage level. Over-voltage inhibit circuit 152, like over-voltage clamp circuit 150, essentially utilizes a stack of zener diodes in series with a $V_{be}$ multiplier to establish the over-voltage inhibit level as is known in the integrated circuit design art. Preferably, a stack of three such diodes are used in series with a $V_{be}$ multiplier, as previously described, to thereby establish an over-voltage inhibit level of between approximately 26.5–32.0 volts.

Input IN 124 is further connected to a current generator circuit 154 which is, in turn, connected to gate drive circuit 156, a current limit circuit 158 and a trimmable resistor $R_T$. Current generator circuit 154 contains a series of known "delta $V_{be}$" current sources which are responsive to the control signal at input IN 124 to supply reference currents to the foregoing circuits.

Input IN 124 is further connected to gate drive circuit 156 which operates under the direction of over-voltage inhibit circuit 152 and current generator circuit 154. If the control signal at input IN 124 is less than the over-voltage inhibit level of between approximately 26.5–32.0 volts, a reference current generated by current generator circuit 154 turns on the gate drive control circuit 156, thereby providing a coil drive signal at output OUT 136. Essentially, gate drive circuit 156 is an output stage having current sourcing and current sinking capability as is known in the integrated circuit design art. Gate drive circuit 156 preferably includes some type of voltage clamp circuitry for clamping the output voltage between approximately 7–8 volts. In a preferred embodiment, gate drive circuit 156 includes a transistor having an input referenced to IN 124 which actively clamps OUT 136 between approximately 7–8 volts. Alternatively, gate drive circuit 156 may include one or more zener diodes, referenced to ground potential at one end thereof, to thereby provide the output voltage clamp. In order to drive the gate 138 of IGBT 145, as previously discussed, output OUT 136 is capable of sourcing at least 3 milliamperes. Gate drive circuit 156 further includes circuitry responsive to the over-voltage inhibit circuit 152 such that if the control signal at input IN 124 exceeds the over-voltage inhibit level of between approximately 26.5–32.0 volts, the current source portion of gate drive circuit 156 is disabled.

Input IN 124 is further connected to current limit circuit 158 which is further connected to current generator circuitry 154, the current source circuitry of gate drive circuit 156 and balance resistors $R_T$ 160 and $R_S$ 162. Balance resistor $R_T$ 160 is a trimmable resistor such that the resistance of $R_T$ 160 may be increased by opening fusible links to thereby incrementally add series resistance to $R_T$ 160. $R_T$ 160 may therefore be "trimmed" to within approximately 2–5% of its desired value during a pre-packaging "wafer test" as is commonly known in the integrated circuit industry. $R_T$ is further connected to a reference current supplied by current generator 154 to provide a fixed reference voltage across $R_T$ 160. Balance resistor $R_S$ 162 is a fixed resistor and is further connected to input $I_S$ 144 for receiving a sense current therethrough equal to a ratio of the load current flowing through output 130 of IGBT 145.

Figure 7:
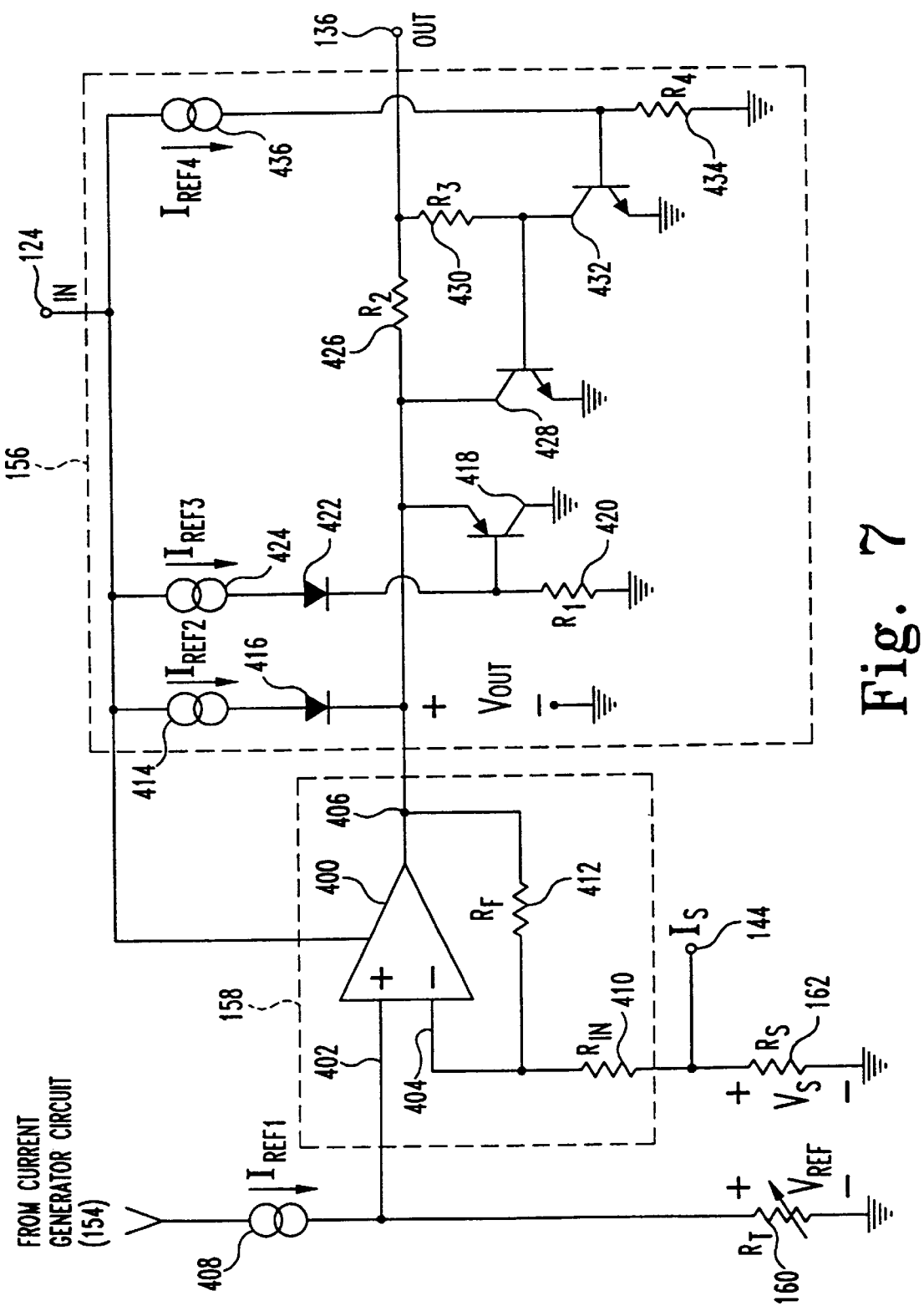
FIG. 7 is a schematic diagram showing a preferred embodiment of the current limit circuitry used in the ignition coil driver module of the present invention.

Referring now to FIG. 7, a preferred embodiment of the current limit circuit 158, along with a portion of the gate drive circuit 156, is shown. Central to current limit circuit is an operational amplifier (op-amp) 400 which may be of known construction, and which is powered via IN 124 as previously discussed. Op-amp 400 has a positive, or non-inverting, input 402 connected to a current source 408, which is preferably part of the current generator circuit 154, and to one end of resistor RT 160. The opposite end of $R_T$ 160 is connected to ground potential so that the current $I_{REF1}$ supplied by current source 408 establishes a fixed reference potential $V_{REF}$ across $R_T$ 160 and therefore at the non-inverting input 402 of op-amp 400.

Op-amp 400 further includes a negative, or inverting, input 404 connected to one end of a feedback resistor $R_F$ 412 and to one end of an input resistor $R_{IN}$ 410. The opposite end of $R_{IN}$ 410 is connected to one end of $R_S$ 162 and to the sense current input $I_S$ 144 of control integrated circuit 112. The opposite end of $R_S$ 162 is connected to ground potential. The opposite end of $R_F$ 412 is connected to the output 406 of op-amp 400. Together, op-amp 400, $R_{IN}$ 410 and $R_F$ 412 make up the current limit circuit 158.

Op-amp output 406 is connected to a portion of the gate drive circuit 156 which includes a diode 416 in series with a gate drive current source 414 which is connected to IN 124. Output 406 is further connected to the emitter of PNP transistor 418. The base of transistor 418 is connected to one end of resistor $R_1$ 420. The opposite end of RI 420, as well as the collector of transistor 418, are connected to ground. The base of transistor 418 is also connected to diode 422 in series with another gate drive current source 424, which is connected to IN 124. Finally, output 406 of op-amp 400 is connected to the collector of NPN transistor 428 and to one end of resistor $R_2$ 426. The base of transistor 428 is connected to the collector of NPN transistor 432 and to one end of resistor $R_3$ 430. The base of transistor 432 is connected to one end of resistor $R_4$ 434 and to current source 436, which is connected to IN 124. The opposite end of $R_4$, as well as the emitters of transistors 428 and 432, are connected to ground. The opposite ends of resistors $R_2$ 426 and $R_3$ 430 are connected to OUT 136 of control integrated circuit 112.

In the operation of gate drive circuit 156, and neglecting for the moment any operational contribution from op-amp 400, current source 414 supplies a current $I_{REF2}$ through diode 416 and current limiting resistor $R_2$ 426 to OUT 136 when IN 124 receives a control signal thereat as previously discussed. Similarly, current source 424 supplies a current $I_{REF3}$ through diode 422, in response to a control signal at IN 124, to the transistor 418 and $R_1$ 420 combination. The values of $I_{REF3}$ and $R_1$ are chosen such that transistor 418 clamps the voltage at OUT 136 at approximately 7–8 volts when the voltage at IN 124 exceeds approximately 7–8 volts. Each of the diodes 416 and 422 are provided to block reverse conduction from OUT 136 to IN 124 in the event that OUT 136 has a voltage threat when no control signal is present at IN 124, such as that which may occur during inductive flyback as previously discussed.

Current source 436 supplies a current $I_{REF4}$ to the transistor 432 and $R_4$ 434 combination in response to a control signal at IN 124. The values of $I_{REF4}$ and $R_4$ are chosen such that transistor 432 is sufficiently turned on when a control signal is present at IN 124 to maintain transistor 428 in an off state. When the control signal is removed from IN, current source 436 is deactivated so that transistor 432 is turned off. If a voltage slightly above the transistor 428 base-emitter forward bias voltage of approximately 600–800 millivolts is thereafter present at OUT 136, transistor 428 turns on to thereby pull OUT 136 down toward ground potential. Transistor 428 and resistor $R_3$ thus act as a gate pull down circuit to maintain OUT 136 near ground potential when no control signal is present at IN 124.

The effect of current limit circuit 158 on the operation of gate drive circuit 156 will now be described in detail. In operation, op-amp 400 supplies an output voltage $V_{OUT}$ according to the equation $V_{OUT} = V_{REF} + (V_{REF} - V_S)(R_F/R_{IN})$, where $V_S$ is the voltage across $R_S$ 162. As OUT 136 is activated in response to a control signal at IN 124, the sense current into input $I_S$ 144 is initially negligible. $V_S$ is thus similarly negligible so that $V_{OUT}$ is equal to $V_{REF}(1+R_F/R_{IN})$. In a preferred embodiment, $V_{REF}$ is set, via appropriate choice of $I_{REF1}$ and trimming of $R_T$ 160 as previously discussed, to approximately 65 millivolts, $R_F$ 412 is set at approximately 20 kohms and $R_{IN}$ 410 is set at approximately 100 ohms. In response to a control signal at IN 124, op-amp 400 and current source 414 thus initially provide a voltage at OUT 136 equal to the smaller of the voltage at IN 124 and the clamp voltage of 7–8 volts, thereby turning on IGBT 145 to full conduction as previously discussed. Preferably, an inductive load, such as a primary coil of an automotive ignition coil, is connected at one end to a voltage source and at its opposite end to input 121 of IGBT 145, so that an increasing load current flows through the primary coil and through a load current path of IGBT 145 defined by input 121 and output 130. A sense current equal to a fraction of the load current is supplied to input $I_S$ 144, as previously discussed, to thereby establish a correspondingly increasing voltage $V_S$ across $R_S$ 162. As $V_S$ increases, $V_{OUT}$ correspondingly decreases according to the above equation. As $V_{OUT}$ decreases, in response to an increasing $V_S$, the voltage at OUT 136 correspondingly decreases, thereby decreasing the gate drive to IGBT 145. $V_{OUT}$ is adjusted, in the above manner, such that circuit equilibrium is reached when $V_S$ is approximately equal to $V_{REF}$. Preferably, IGBT 145 is arranged so that the sense current is approximately a 1/100 fraction of the load current flowing through output 130 as previously described, and $R_S$ 162 is set at approximately 0.888 ohms so that the voltage at OUT 136 when $V_S = V_{REF}$ is approximately 2.35 volts and the load current flowing through output 130 is between approximately 6–7 amperes.

Although the current limit circuit 158 is shown and described as being a known operation amplifier 400 with a fixed gain, it is to be understood that the function performed thereby may also be performed by other known error amplifier arrangements such as, for example, an emitter coupled amplifier. Those skilled in the integrated circuit design art will appreciate that the structure of such an error amplifier may take on many forms, and that the importance of the error amplifier lies not in its particular error amplifying technique, but in its overall ability to effectuate modulation of the IGBT gate drive voltage based on predetermined levels of sense current supplied by IGBT 145 to $I_S$ 144.

Figure 4:
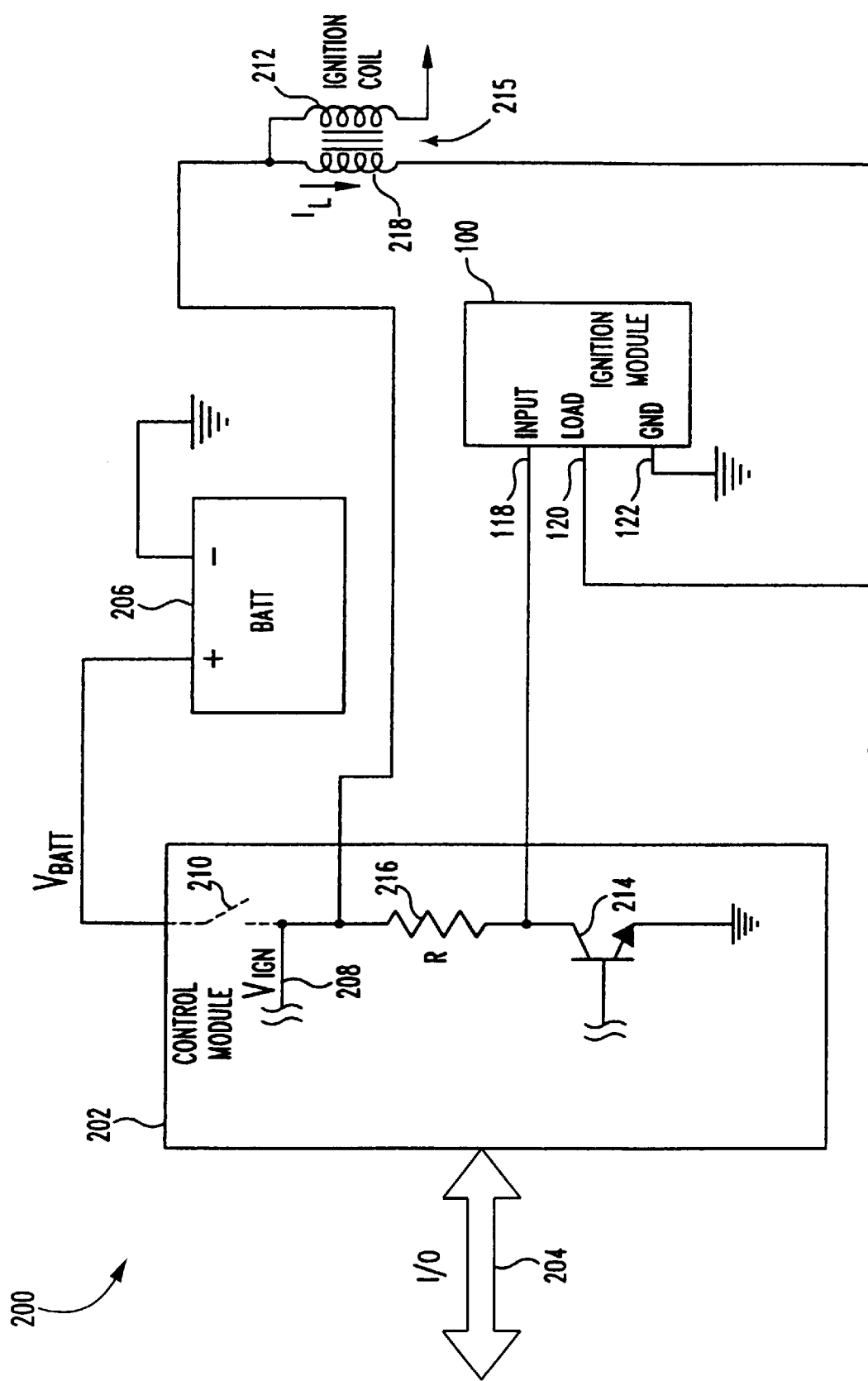
FIG. 4 is a schematic diagram showing a typical implementation of the ignition coil driver module of FIG. 3 in an ignition control system.

Referring now to FIG. 4, a typical ignition control system 200 is shown incorporating the ignition coil driver module 100 of FIG. 3 therein. Central to ignition control system 200 is control module 202, sometimes referred to in the automotive industry as an electronic control module (ECM) or power-train control module (PCM). By either name, control module 202 is a computer controlled module, typically under microprocessor control, and includes read-only-memory (ROM) and random-access-memory (RAM) for storing data and software algorithms executable by the microprocessor (not shown). Control module 202 includes a plurality of input and output (I/O) 204 connections for interfacing with various operational and diagnostic signals.

Control module 202 is powered by battery 206 which provides a battery voltage $V_{BATT}$ of between approximately 7.0 volts and 24 volts, with typical $V_{BATT}$ voltages being in the range of approximately 12–16 volts.

As shown in FIG. 4, battery voltage $V_{BATT}$ is connected to a switch 210 which is, in turn, connected to a signal line labeled VIGN 208. Although shown as a physical switch within control module 202, switch 210 preferably represents a portion of a vehicle ignition switch operable via an ignition key. Ignition key switch (not shown) typically has an "off" position, an "on" position and a "crank" position. When the ignition key switch is switched from the "off" position to either the "crank" position or the "on" position (hereinafter referred to as an "ignition signal"), switch 210 connects the voltage $V_{BATT}$ to the VIGN 208 line. VIGN line 208 is connected to one end of the primary 218 and secondary 212 coils of the ignition coil 215, and to one end of a pull-up resistor R 216. The other end of resistor R 216 is connected to the collector of transistor 214 and to INPUT 118 of ignition coil driver module 100. The emitter of transistor 214 is referenced at ground potential and the base of transistor 214 is driven by circuitry within control module 202. LOAD 120 of ignition coil driver module 100 is connected to the remaining end of the primary coil 218 of the ignition coil 215.

Referring now to FIGS. 4 and 5A–5C, the operation of ignition coil driver module 100 within ignition control system 200 will now be described with a $V_{BATT}$ voltage of 14 volts. In response to an ignition signal received via switch 210, control module 202 connects battery voltage $V_{BATT}$ to VIGN 208. Control module 202 then receives vehicular operational and diagnostic data via I/O 204 and determines therefrom the appropriate spark advance and dwell time for optimal engine operation as is known in the automotive industry. Based upon the determination of spark advance, dwell time and other factors such as $V_{BATT}$ level, for example, control module 202 provides a predetermined duration low drive signal to normally on transistor 214, which causes INPUT 118 of ignition coil driver module 100 to be connected to VIGN 208 through resistor R 216. Ignition control driver module 100 has been designed to draw an operating current of between approximately 2–3 milliamperes at INPUT 118, so that resistor R 216 is chosen to be approximately 500 ohms.

With $V_{BATT}$, and hence VIGN, equal to 14 volts, and taking into account the voltage drop across R 216 due to the 2–3 milliampere operating current, the voltage 220 (FIG. 5A) at INPUT 118 rises to approximately 12.5 volts in response to the low drive signal impressed upon transistor 214 by control module 202. Upon receiving 12.5 volts at INPUT 118, the current generator 154 and gate drive 156 circuits are energized. Since the voltage at INPUT 118 is less than the over-voltage inhibit voltage of over-voltage inhibit circuit 152, but greater than the clamp voltage of the output circuitry of gate drive circuit 156, the voltage 222 (FIG. 5B) at OUT 136 of control integrated circuit 112 rises immediately to the clamp voltage of approximately 7 volts.

A voltage of approximately 7 volts at OUT 136 turns on IGBT 145 to full conduction so that a load current $I_L$ 224 (FIG. 5C) begins to increase through the primary coil 218 of the ignition coil 215. A 100:1 ratio of the load current $I_L$ is fed back as a sense current $I_S$ to the current limit circuit 158 of control integrated circuit 112 via IGBT leg 142. When the load current $I_L$ increases to approximately 6 amperes (corresponding to a sense current $I_S$ of approximately 60 milliamperes), the current limit circuit 158 begins to pull current out of the current source 414 (FIG. 7) of the gate drive circuit 156 as previously discussed, thereby decreasing the IGBT drive voltage at OUT 136 of control integrated circuit 112. Equilibrium within current limit circuit 158 is reached when the load current $I_L$ 224 reaches approximately 7 amperes, corresponding to a voltage at OUT 136 of approximately 2.35 volts. Load current $I_L$ 224 is thereafter maintained at a constant 7 ampere level for the duration of the low drive signal impressed upon transistor 214 by control module 202. When transistor 214 is turned back on, the various circuits within control integrated circuit 112 are returned to their de-energized state, thereby turning off the drive voltage 222 to the gate 138 of IGBT 145.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected. For example, although the ignition coil driver module 100 is shown and described as driving the primary coil 218 of an ignition coil 215, it is to be understood that the present invention contemplates alternate embodiments wherein the dual integrated circuit concept of the present invention may be implemented in a control system required to drive any high current inductive, resistive or capacitive load, or any combination thereof. As a second example, although the ignition coil driver module 100 is shown and described as being implemented as a so-called low side driver, it is to be understood that module 100 can also be made to operate as a high-side driver, i.e. with the IGBT 145 connected directly to VIGN 208, and the load (primary coil 218) being connected between IGBT 145 and ground potential. Those skilled in the art will recognize that only minor modifications to control integrated circuit 112 need be made in order to effectuate such an arrangement such as, for example, the addition thereto of voltage doubling circuitry for driving the gate of the IGBT 145. As a final example, it is to be understood that the fractional current ratio of sense current to load current shown in the preferred embodiment discussed herein should be considered to be illustrative of only one application of the current limiting feature approach discussed herein. The present invention further contemplates that IGBT 145 may be alternately configured to provide a sense current being a greater fraction of the load current. In other words, the present invention contemplates applications of the concepts described above wherein the load current flowing through IGBT output 130 is small compared to the sense current flowing through output 142 so that the control integrated circuit is responsive to a relatively large sense current to modulate the gate drive of the IGBT based on substantially smaller predetermined load currents flowing through IGBT output 130.

Figure 8:
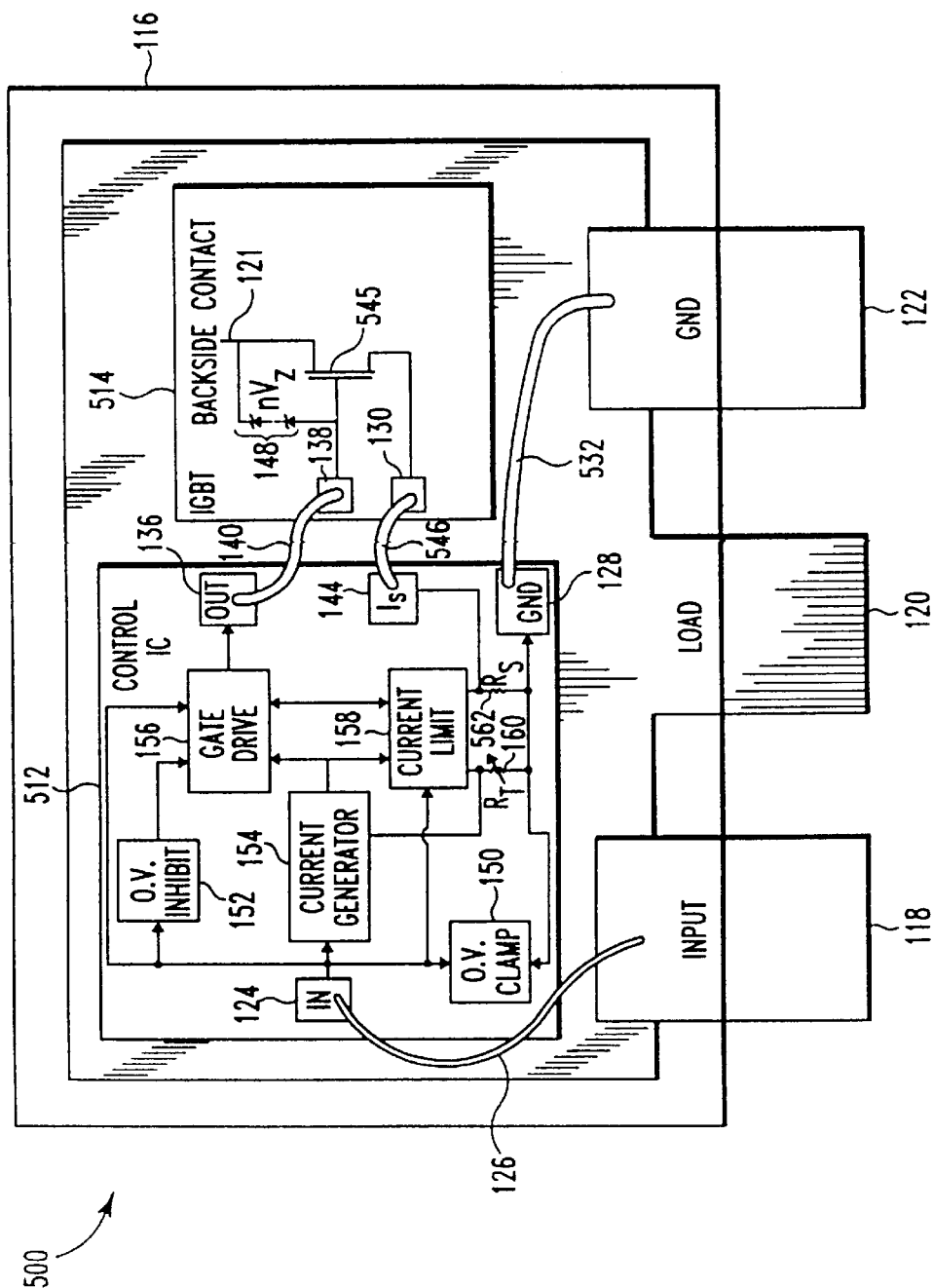
FIG. 8 is a schematic diagram of an alternate embodiment of an ignition coil driver module in accordance with the present invention.

Referring now to FIG. 8, an alternate embodiment of an ignition control drive module 500 is shown. Ignition control drive module 500 is, in many respects, identical to ignition control drive module 100 as shown and described with respect to FIG. 3, and like reference numbers are therefore used to identify like components.

As an important distinction over ignition control drive module 100, however, ignition control drive module 500 includes a modified high current load drive integrated circuit 514. Specifically, high current load drive integrated circuit 514 includes a power transistor 545 having only a single load current output 130. Preferably, power transistor 545 is an IGBT identical to IGBT 145 shown and described with respect to FIG. 5, with the exception that none of the source cells are "split out". In providing IGBT 545, metal patterns 318 and 320 (FIG. 5) may thus be merged into a single continuous layer in contact with all source cells (all contact regions 310 of FIG. 6) to provide a single source output 130. Although power transistor 545 is preferably an IGBT, the present invention contemplates utilizing any suitable power transistor such as, for example, a power MOSFET or a power BJT.

Another difference in module 500 over module 100 of FIG. 3 is a modification of the control integrated circuit 512. Specifically, the sense resistor $R_S$ 562 must be an extremely low valued resistor to establish a voltage at OUT 136 of approximately 2.35 volts when $V_S = V_{REF}$ as previously described. To this end, $R_S$ 562 is preferably set at approximately 0.0088 ohms so that the full load current of between approximately 6–7 amperes flowing therethrough satisfies the foregoing requirements. In order to satisfy the extremely low resistance value requirement, $R_S$ 562 is preferably formed of an appropriately sized metalization pattern connected only between bond pads $I_S$ 144 and GND 128.

Bond wire 546 connects IGBT output 130 to the $I_S$ 144 input, and bond wire 532 connects GND 128 directly to the GND terminal 122 of module 500. Bond wires 546 and 532 are appropriately sized to safely and reliably permit the full load current $I_L$ to flow from output 130 of power transistor 545 to the GND terminal 122 of module 500. As with the previous embodiment, bond wires are preferably used to interconnect the integrated circuits and to connect the integrated circuits to the module terminals, although the present invention contemplates utilizing other known electrical connection means such as TAB bonding and the like.

With the foregoing modifications of ignition coil driver module 500, the various advantages of the dual integrated circuit ignition module approach are maintained. Although the entire load current is forced through $R_S$ 562 so that the current limiting operation depends upon the voltage drop there across as with prior art systems, $R_S$ 562 is designed to be sufficiently low in value so that this voltage drop does not add significantly to the saturation voltage of IGBT 545. Moreover, since this voltage drop is quite low (~50–60 mv), power dissipation is also quite low (~0.3–0.4 W). Thus, $R_S$ 562 may be included within control integrated circuit 512 so that resistance matching with $R_T$ 160 may be performed as previously discussed. In this way, circuit simplicity is achieved while retaining the benefits, described above, of the dual integrated circuit approach. Finally, module 500 provides the further advantages of simplifying the design and fabrication of power transistor 545 as well as decreasing the possibility of bond wire failure by reducing the number of bond wires by one.

In operation, ignition coil driver module 500 functions identically to that of ignition coil driver module 100 within an ignition control system such as that shown and described with respect to FIG. 4. As such, ignition coil driver module 500 may directly replace module 100 shown therein. Within the module itself, the operation of driver module 500 differs from that of module 100 only in that the entire load current flowing through power transistor 545 also flows through sense resistor $R_S$ 562. In all other respects, the operation of integrated circuits 512 and 514 are identical to those of integrated circuits 112 and 114 respectively as described herein.

The embodiments of the invention in which an exclusive property or privilege is claimed are defined as follows:

1. A method of limiting current through a load connected in series with a voltage source and a high voltage load energizing device, the method comprising the steps of:

(1) driving a high voltage load energizing device formed of a high voltage semiconductor material arranged as a first integrated circuit with a low voltage control circuit formed of a low voltage semiconductor material arranged as a second integrated circuit sufficiently to permit a load current equivalent to that demanded by a load to flow from a voltage source through the load and the high voltage load energizing device;

(2) directing an entire amount of the load current through the low voltage control circuit;

(3) monitoring the load current flowing through the low voltage control circuit; and (4) driving the high voltage load energizing device with the low voltage control circuit sufficiently to limit the load current flowing therethrough to a predetermined load current value in response to the load current exceeding the predetermined load current value.

2. The method of claim 1 wherein step (3) further includes the steps of:

(3)(a) converting the load current flowing through the low voltage control circuit to sense voltage; and (3)(b) comparing the sense voltage to a reference voltage established within the low voltage control circuit;

and wherein the predetermined load current value corresponds to the load current flowing through the low voltage control circuit when the sense voltage is approximately equal to the reference voltage.

3. The method of claim 2 wherein step (3)(a) includes directing the load current through a low valued resistor forming a part of the low voltage control circuit.

4. The method of claim 1 wherein the load is an inductive load.

5. The method of claim 4 wherein the inductive load is a primary coil of an ignition coil for an internal combustion engine.

6. The method of claim 1 wherein the high voltage load energizing device is a power transistor having a drain, source and gate;

and wherein the driving portions of each of steps (1) and (4) include the step of:

providing a low voltage drive signal to the gate of the power transistor such that the load current flows from the drain to the source in response thereto.

7. A load driving circuit having a load current limiting feature comprising:

a high voltage load driving device formed of a high voltage semiconductor material arranged as a first integrated circuit and responsive to a low voltage load drive signal to permit a load current to flow through said high voltage load driving device and a load connected thereto; and a low voltage control circuit formed of a low voltage semiconductor material arranged as a second integrated circuit and connected to said high voltage load driving device to provide said low voltage load drive signal thereto and receive an entire amount of said load current therefrom, said low voltage control circuit being responsive to said load current flowing therethrough to provide a first low voltage load drive signal if said load current is below a predetermined current value, and to provide a second reduced low voltage load drive signal if said load current exceeds said predetermined current value.

8. The load driving circuit of claim 7 wherein said high voltage load driving device is responsive to said first low voltage load drive signal to permit a load current equivalent to that demanded by the load to flow therethrough.

9. The load driving circuit of claim 8 wherein said high voltage load driving device is responsive to said second reduced low voltage load drive signal to limit the load current flowing therethrough to said predetermined current value.

10. The load driving circuit of claim 9 wherein said high voltage load driving device is a power transistor having a gate, drain and source, said power transistor being responsive to said first and second low voltage load drive signals impressed upon said gate to permit the load current to flow from said drain to said source.

11. The load driving circuit of claim 9 wherein said low voltage control circuit further includes:

a reference resistor having a constant reference voltage established there across; and a sense resistor responsive to said load current flowing therethrough to establish a sense voltage there across;

and wherein said load current is equal to said predetermined current value when said sense voltage is approximately equal to said reference voltage.

12. The load driving circuit of claim 11 wherein said sense resistor is formed of integrated circuit metalization.

13. The load driving circuit of claim 12 wherein said reference resistor is adjustable within a predetermined resistance range.

14. The load driving circuit of claim 7 wherein the load is an inductive load.

15. The load driving circuit of claim 14 wherein the inductive load is a primary coil of an internal combustion engine ignition coil.

16. The load driving circuit of claim 7 further including a housing having said first and second integrated circuits mounted therein.

* * * * *